(12) United States Patent
Chae et al.

(10) Patent No.: US 7,619,929 B2
(45) Date of Patent: *Nov. 17, 2009

(54) BIAS CIRCUITS AND METHOD FOR ENHANCED RELIABILITY OF FLASH MEMORY DEVICE

(75) Inventors: Dong-Hyuk Chae, Seoul (KR); Young-Ho Lim, Yongin-si (KR)

(73) Assignee: Samsung Electronics Co., Ltd, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/201,977

(22) Filed: Aug. 29, 2008

(65) Prior Publication Data

US 2008/0316834 A1    Dec. 25, 2008

Related U.S. Application Data

(63) Continuation of application No. 11/320,096, filed on Dec. 28, 2005, now Pat. No. 7,433,235.

(30) Foreign Application Priority Data

Jun. 27, 2005    (KR) ............................... 2005-55899

(51) Int. Cl.
    *G11C 11/34* (2006.01)
(52) U.S. Cl. .............................. 365/185.18; 365/189.09
(58) Field of Classification Search ............. 365/185.18
    See application file for complete search history.

(56) References Cited

U.S. PATENT DOCUMENTS 5,731,720 A * 3/1998 Suzuki et al. ................. 327/77
6,459,114 B1 10/2002 Nakamura et al.
6,809,365 B2 10/2004 Nakamura et al.
6,925,009 B2 * 8/2005 Noguchi et al. ......... 365/185.17
2002/0050607 A1 5/2002 Nakamura et al.
2005/0169021 A1 * 8/2005 Itoh ............................. 363/60

FOREIGN PATENT DOCUMENTS

| JP | 2002-133885 | 5/2002 |
| KR | 0161410 | 2/1999 |
| KR | 10-2002-0042749 | 6/2002 |
| KR | 2002-0094502 | 12/2002 |

* cited by examiner

*Primary Examiner*—Hoai V Ho
*Assistant Examiner*—Jason Lappas
(74) *Attorney, Agent, or Firm*—Muir Patent Consulting, PLLC

(57) ABSTRACT

A non-volatile semiconductor memory device includes: cell strings connected to respective bit lines; each of the cell strings having a string select transistor connected to a string select line, a ground select transistor connected to a ground select line, and memory cells connected to corresponding word lines and connected in series between the string select transistor and the ground select transistor; a first voltage drop circuit configured to reduce an applied read voltage during a read operation; a second voltage drop circuit configured to reduce the applied read voltage; a string select line driver circuit configured to drive the string select line with the reduced voltage provided by the first voltage drop circuit; and a ground select line driver circuit configured to drive a ground select line with the reduced voltage provided by the second voltage drop circuit.

7 Claims, 6 Drawing Sheets

BIAS CIRCUITS AND METHOD FOR ENHANCED RELIABILITY OF FLASH MEMORY DEVICE

RELATED APPLICATIONS

This application is a continuation application of U.S. application Ser. No. 11/320,096, filed Dec. 28, 2005, which claims the benefit of Korean Patent Application No. 2005-55899, filed on Jun. 27, 2005, in the Korean Intellectual Property Office, the disclosure of which is incorporated herein in its entirety by reference.

FIELD OF THE INVENTION

The present invention is related to a semiconductor memory device and a read voltage supplying method in such a device. In particular, the present invention is related to a non-volatile semiconductor memory device and a read voltage supplying method in such a device.

BACKGROUND OF THE INVENTION

Non-volatile semiconductor memory devices such as a flash EEPROM devices (hereinafter, referred to as a flash memory devices) are widely used as storage devices in portable electronic system, digital still cameras, computers, mobile communications terminals, memory cards, and the like. Flash memory devices can roughly classified as NAND flash memory devices and NOR flash memory devices. The NOR flash memory device has a cell structure whereby a plurality of memory cells are connected in parallel with a bit line. The cell structure of the NOR flash memory device is unsuitable for high-density flash memory devices since contact holes are formed on source and drain regions of each memory cell. On the other hand, the NAND flash memory device has a cell structure (or a string structure) whereby a plurality of memory cells are connected in series to a bit line. Accordingly, the NAND flash memory device enjoys a higher integration density than that of the NOR flash memory device. As well known in the art, the NAND flash memory device requires a string select transistor and a ground select transistor in respective strings. Each of the string and ground select transistors has a thin gate oxide layer of about 50 Å to 100 Å, while each of cell transistors has a gate structure where a tunnel oxide layer, a floating gate, an insulation layer and a control gate are stacked in the order stated.

FIG. 1 illustrates a block diagram of a conventional NAND flash memory device. Referring to FIG. 1, the NAND flash memory device includes a memory cell array 100, a string select line driver circuit 110, a ground select line driver circuit 120, a word line driver circuit 130, a charge pump circuit 140, a high voltage regulator circuit 150, and a block decoder circuit 160. A string corresponding to one bit line is illustrated in the memory cell array 100 of FIG. 1. A string connected to a bit line BL consists of a string select transistor SST, a plurality of memory cells (or unit cells) Cn-1 to C0 and a ground select transistor GST. The transistors SST and GST and the unit cells Cn-1 to C0 are connected to select lines SSL and GSL and word lines WLn-1 to WL0, respectively. The select lines SSL and GSL are connected to the string select line driver circuit 110 and the ground select line driver circuit 120 through corresponding transistors ST and GT, respectively. The word lines WLn-1 to WL0 are connected to the word line driver circuit 130 through corresponding select transistors WTn-1 to WT0, respectively.

The charge pump circuit 140 generates a read voltage VREAD during a read operation, and the voltage regulator circuit 150 controls the charge pump circuit 140 so that the read voltage VREAD is maintained at a constant level. The string select line driver circuit 110 receives the read voltage VREAD and drives a signal line SS with the read voltage VREAD in response to a control signal Read_EN. The ground select line driver circuit 120 receives the read voltage VREAD and drives a signal line GS with the read voltage VREAD in response to the control signal Read_EN. The word line driver circuit 130 receives the read voltage VREAD and selects one of signal lines Sn-1 to S0 in response to a word line address and the control signal Read_EN. The word line driver circuit 130 drives the selected signal line with a voltage of 0V and unselected select lines with the read voltage VREAD. The block decoder circuit 160 receives a high voltage VPP and drives a block word line BLKW in response to a block address.

As shown in FIG. 1, during a read operation, a selected word line (e.g., WL0) is driven with 0V, while unselected word lines (e.g., WLn-1 to WL1) are driven with a read voltage VREAD as a pass voltage. The pass voltage prevents unselected cells in a string from limiting an on-cell current. Like the unselected word lines, the string and ground select lines SSL and GSL are driven with the read/pass voltage VREAD in order to prevent an on-cell current from being limited. For this reason, the driver circuits 110, 120 and 130 are formed of high-voltage switches for driving corresponding signal lines with the pass voltage being a common voltage.

FIG. 2 shows a block diagram of a string/ground select line driver circuit in FIG. 1. As illustrated in FIG. 2, a string/ground select line driver circuit 110/120 consists of a high-voltage switch 112 that outputs an input voltage VREAD in response to a control signal Read_EN indicating a read operation. It is apparent to one skilled in the art that unlike conventional switches, the high-voltage switch 112 is a circuit for transferring an input voltage signal to an output voltage signal in response to a control signal.

FIG. 3 shows voltage levels of word lines WLn-1 to WL0 and select lines SSL and GSL when a control signal Read_EN is activated. As illustrated in FIG. 3, unselected word lines and select lines SSL and GSL are driven with a pass/read voltage VREAD through corresponding driver circuits, and a selected word line is driven with 0V.

The above-described NAND flash memory device has the following problem. As the NAND flash memory devices continue to become more highly integrated, and to have a larger capacity, the cell size become scaled down. Decrease in a cell size means that the thickness of the tunneling oxide layer is reduced. As described above, a gate oxide layer of respective string and ground select transistors consists of such a tunneling oxide layer. Accordingly, the gate oxide layer of the respective select transistors becomes relatively thin. Meanwhile, since a pass voltage VREAD to an unselected bit line must be sufficiently higher than the highest threshold voltage of a programmed cell, the threshold voltage distribution of programmed cells becomes relatively wide. In the case of a multi-bit flash memory device where plural threshold voltage distributions exist, the pass voltage VREAD must become higher. For example, if a thickness of a tunneling oxide layer is 6 nm and a pass voltage VREAD is 6V, an electric field of 10 MV/cm is applied across the tunneling oxide layer that is used as a gate oxide layer of the respective select transistors. The gate oxide layers can be broken down by the electric field. This causes a decrease in the reliability of the string and ground select transistors. In other words, gate oxide layers of the select transistors can become degraded owing to the high voltage that is applied during a read operation and owing to the stress of repeated read operations over time, thus causing a progressive failure. As a result, malfunction of string cells can occur.

In the case of a NAND flash memory device that uses a relatively thin oxide layer as gate oxide layers of string and ground select transistors, the electric field with respect to the gate oxide layer of the respective select transistors is larger in strength than the electric field to a tunnel oxide layer and a gate interlayer insulation layer of a cell transistor. One technique for solving this problem is to use a relatively thick oxide layer, such as the thickness adopted to high-voltage transistors, as a gate oxide layer of the string and ground select transistors. For this, the select transistors must be formed to have different threshold voltages and oxide layer thickness from the cell transistors in word lines adjacent to the select transistors. In this case, the string size is necessarily increased, and as such, it is impractical to actually adopt such a technique to the NAND flash memory device.

SUMMARY OF THE INVENTION

The present invention is directed to a technique for mitigating stress that is applied to a gate oxide layer during a read operation by reducing a voltage difference between a bulk and a gate of the respective string select transistors and ground select transistors.

Embodiments of the invention provide a flash memory device with improved reliability.

Other embodiments of the invention provide a read voltage supplying circuit of a flash memory device capable of reducing degradation of gate oxide layers of string and ground select transistors.

Other embodiments of the invention provide a read voltage supplying method of a flash memory device capable of reducing degradation of gate oxide layers of string and ground select transistors.

In one aspect, the present invention is directed to a non-volatile semiconductor memory device comprising: cell strings connected to respective bit lines; each of the cell strings having a string select transistor connected to a string select line, a ground select transistor connected to a ground select line, and memory cells connected to corresponding word lines and connected in series between the string select transistor and the ground select transistor; a first voltage drop circuit configured to reduce an applied read voltage during a read operation; a second voltage drop circuit configured to reduce the applied read voltage; a string select line driver circuit configured to drive the string select line with the reduced voltage provided by the first voltage drop circuit; and a ground select line driver circuit configured to drive a ground select line with the reduced voltage provided by the second voltage drop circuit.

In one embodiment, the reduced voltage provided by the first voltage drop circuit is the same as the reduced voltage provided by the second voltage drop circuit.

In another embodiment, the reduced voltage provided by the first voltage drop circuit is higher than the reduced voltage provided by the second voltage drop circuit.

In another embodiment, the reduced voltage provided by the first voltage drop circuit is lower than the reduced voltage provided by the second voltage drop circuit.

In another embodiment, each of the first and second voltage drop circuits is configured to reduce the read voltage by $2V_{th}$, where $V_{th}$ is a threshold voltage of an NMOS transistor.

In another embodiment, each of the first and second voltage drop circuits is configured to reduce the read voltage by $N*V_{th}$, where N is an integer and $V_{th}$ is a threshold voltage of an NMOS transistor.

In another aspect, the present invention is directed to a non-volatile semiconductor memory device having a plurality of memory blocks each including first transistors for selecting a plurality of word lines and second transistors for selecting string select lines and ground select lines, the device further comprising: a charge pump configured to generate a read voltage during a read operation; a voltage regulator configured to control the charge pump so that the read voltage is maintained at a constant level; a first driver circuit configured to transfer the read voltage to the first transistors during the read operation; a voltage drop circuit configured to reduce the read voltage from the charge pump to generate a reduced voltage; and a second driver circuit configured to transfer the reduced voltage to the second transistors during the read operation.

In one embodiment, the voltage drop circuit reduces the read voltage by a voltage that corresponds to a sum of threshold voltages of plural transistors.

In another embodiment, the voltage drop circuit includes first and second voltage drop portions for reducing the read voltage, an output voltage of the first voltage drop portion being applied to the string select line by the second driver circuit and an output voltage of the second voltage drop portion being applied to the ground select line by the second driver circuit.

In another embodiment, the output voltage of the first voltage drop portion is identical to the output voltage of the second voltage drop portion.

In another embodiment, the output voltage of the first voltage drop portion is higher than the output voltage of the second voltage drop portion.

In another embodiment, the output voltage of the first voltage drop portion is lower than the output voltage of the second voltage drop portion.

In another embodiment, each of the first and second voltage drop parts is configured to reduce the read voltage by $2V_{th}$, where $V_{th}$ is a threshold voltage of an NMOS transistor.

In another aspect, the present invention is directed to a read voltage supplying method in a non-volatile semiconductor memory device which comprises cell strings connected to respective bit lines, each of the cell strings having a string select transistor connected to a string select line, a ground select transistor connected to a ground select line, and memory cells connected between the select transistors and connected to corresponding word lines, the method comprising: generating a read voltage to be supplied to unselected word lines; reducing the read voltage by a predetermined voltage; supplying the reduced read voltage to the string select lines and ground select lines in response to a control signal indicating a read operation; and supplying the read voltage to the unselected word lines and a ground voltage to a selected word line in response to the control signal.

In one embodiment, the reduced read voltage is reduced by $2V_{th}$, where $V_{th}$ is a threshold voltage of an NMOS transistor.

In another embodiment, the read voltage is reduced by $N*V_{th}$, where N is an integer and $V_{th}$ is a threshold voltage of an NMOS transistor.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 1:
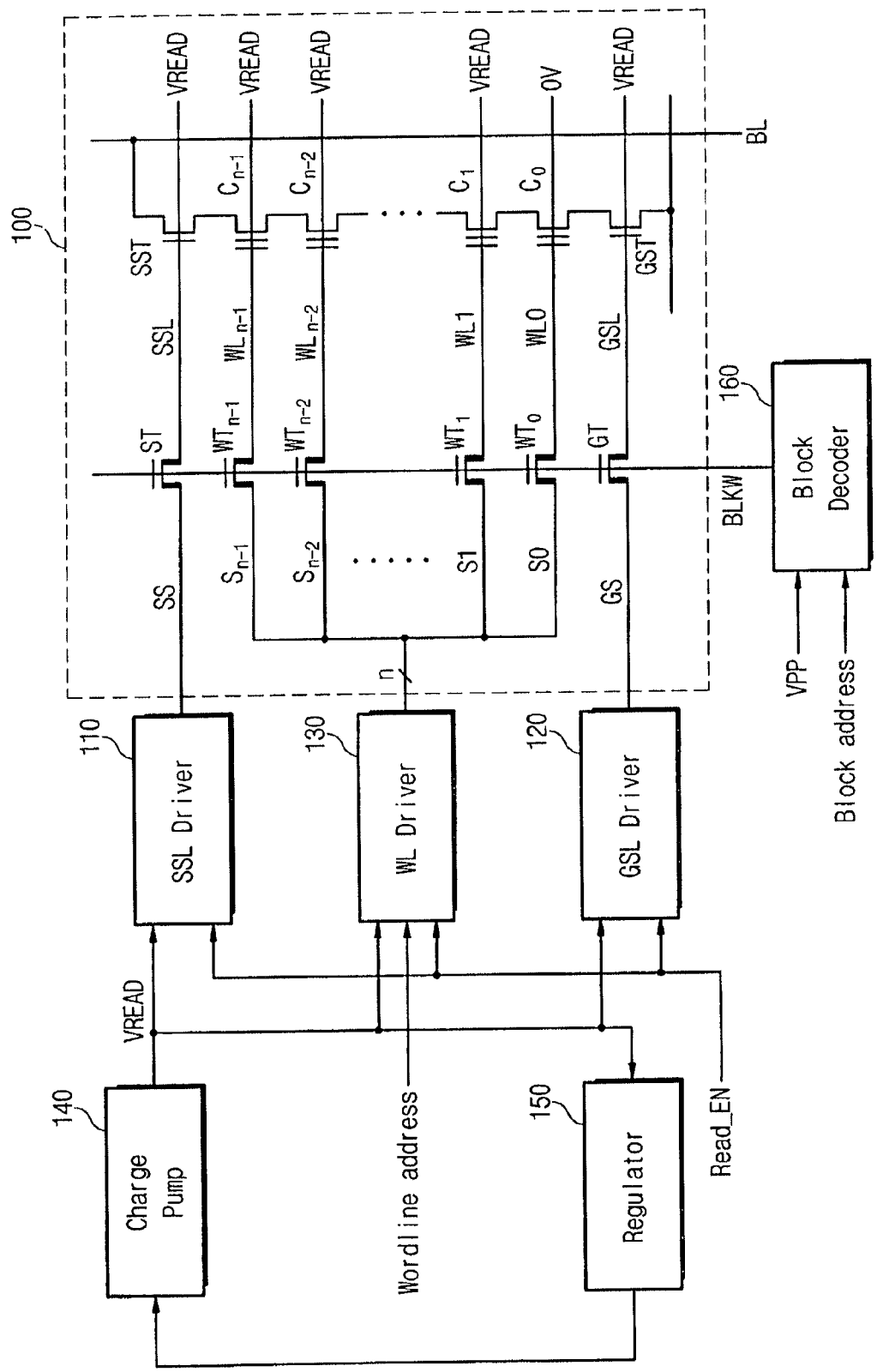
FIG. 1 is a block diagram of a conventional NAND flash memory device.
Figure 2:
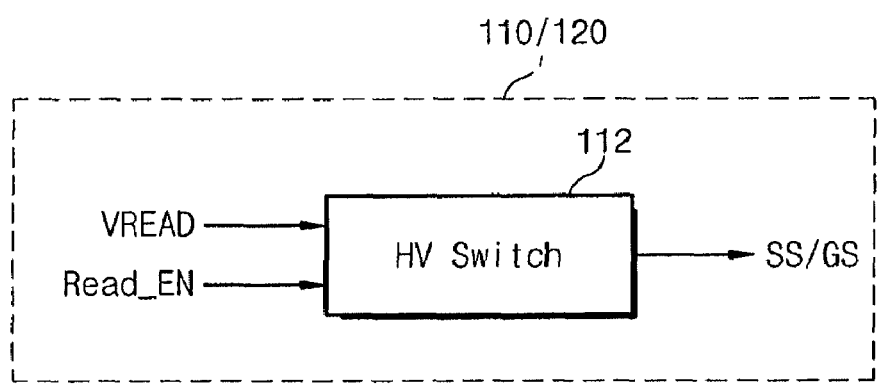
FIG. 2 is a block diagram of a string/ground select line driver circuit of FIG. 1.
Figure 3:
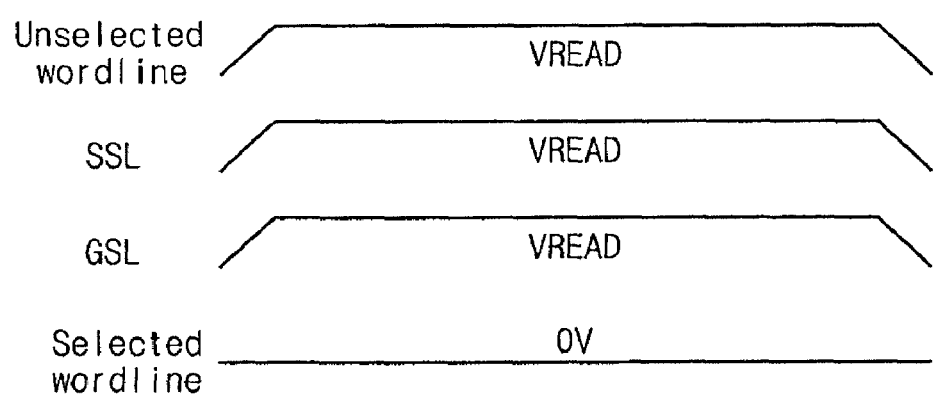
FIG. 3 illustrates voltage levels of word lines and select lines when a control signal Read_EN is activated, in the embodiment of FIG. 1.
Figure 4:
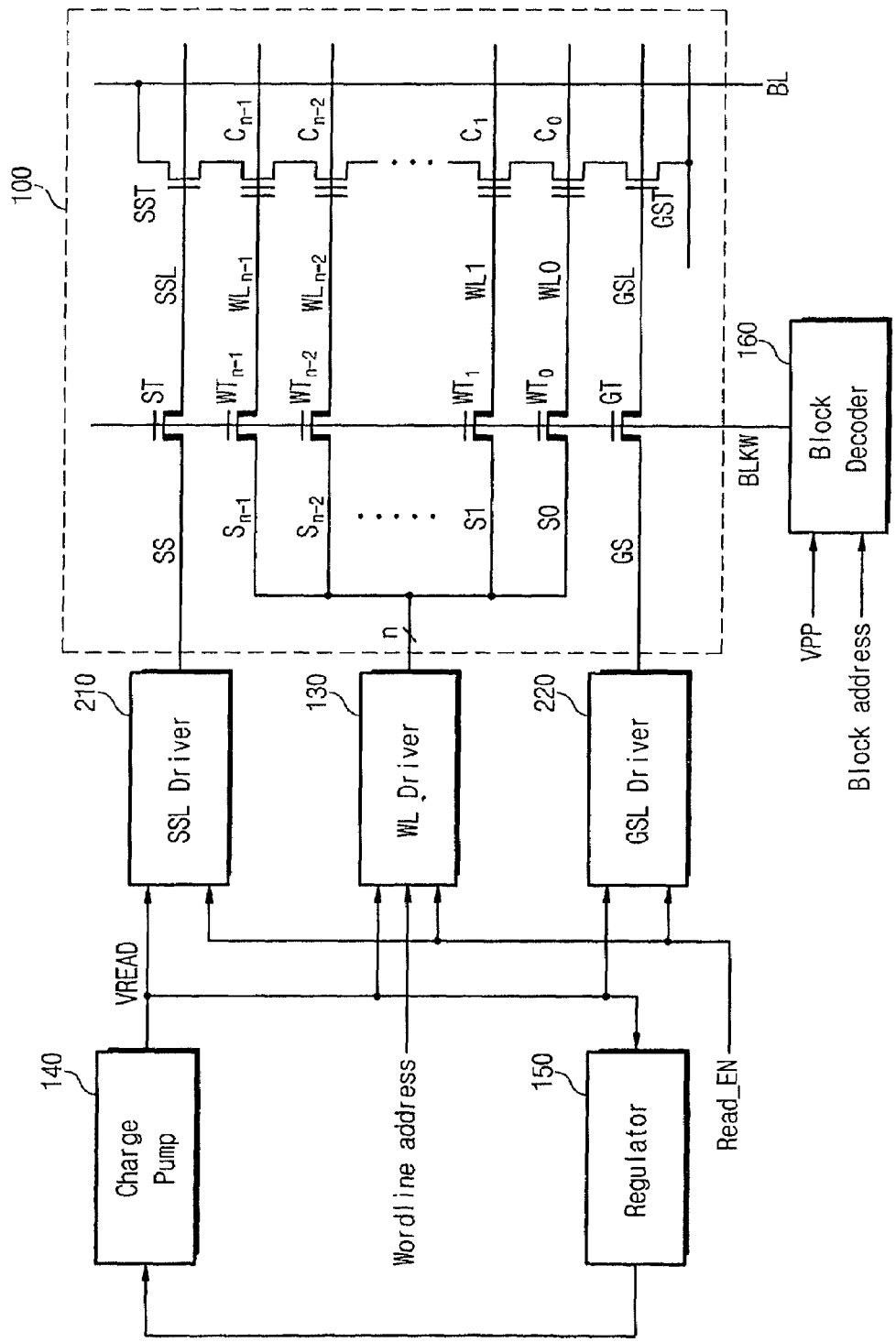
FIG. 4 is a block diagram of a flash memory device according to the present invention.

FIG. 4 is a block diagram of a flash memory device according to the present invention. A flash memory device in FIG. 4 is nearly the same as that in FIG. 1 except for string and ground select line driver circuits 210 and 220. In FIG. 4, constituent elements that are identical to those in FIG. 1 are marked by the same reference numerals, and description thereof is thus omitted.

Each of the string and ground select line driver circuits 210 and 220 according to the present invention receives a read/pass voltage VREAD from a charge pump circuit 140. The string select line driver circuit 210 lowers or drops the received voltage VREAD in response to a control signal Read_EN and drives a signal line SS with the reduced voltage. This means that a string select line SSL is driven through a transistor ST with a voltage lower than the read voltage VREAD. Likewise, the ground select line driver circuit 220 lowers or drops the received voltage VREAD in response to a control signal Read_EN and drives a signal line GS with the reduced voltage. This means that a ground select line SSL is driven through a transistor GT with a voltage lower than the read voltage VREAD. Accordingly, it is possible to reduce the progressive failure of the string and ground select transistors SST and GST by supplying a lower voltage than the read voltage VREAD to the select lines SSL and GSL. That is, during a read operation, unnecessary stress to gate oxide layers of the string and ground select transistors is reduced which is caused when the voltage applied to a word line is the same as that applied to gates of the select transistors.

Figure 5A:
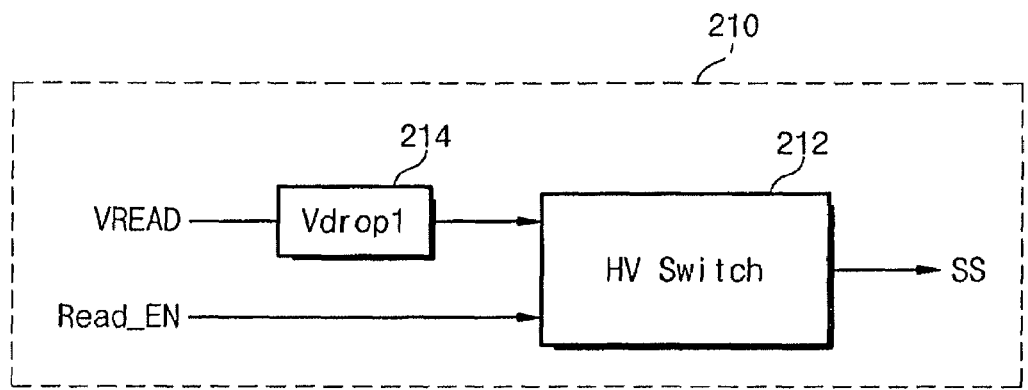
FIG. 5A is a block diagram of a string select line driver circuit illustrated in FIG. 4.

FIG. 5A is a block diagram of a string select line driver circuit illustrated in FIG. 4. Referring to FIG. 5A, a string select line driver circuit 210 comprises a high-voltage switch 212 and a voltage drop circuit 214. The voltage drop circuit 214 generates an output that is lower than an applied read voltage VREAD and outputs the dropped, or lowered, voltage to the high-voltage switch 212. The high-voltage switch 212 drives a signal line SS using the lowered voltage from the voltage drop circuit 214 in response to a control signal Read_EN. In this manner, the string select line SSL is driven using a voltage that is lower than the read voltage VREAD.

Figure 5B:
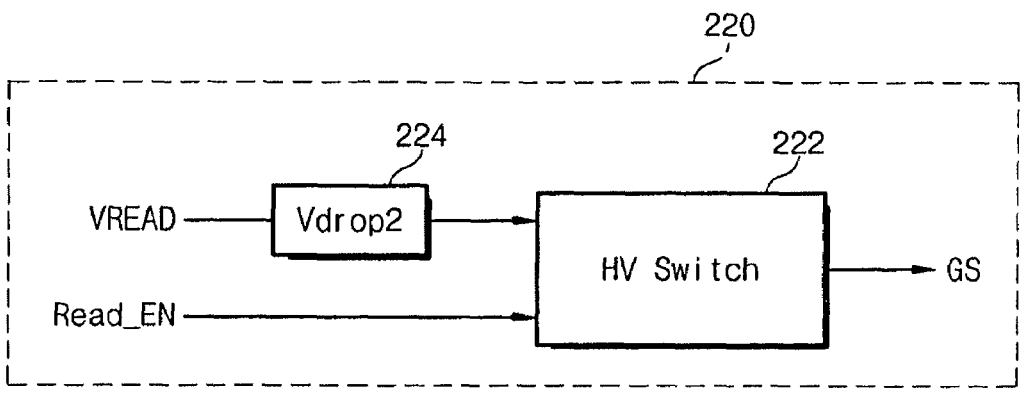
FIG. 5B is a block diagram of a ground select line driver circuit illustrated in FIG. 4.

FIG. 5B is a block diagram of a ground select line driver circuit illustrated in FIG. 4. Referring to FIG. 5B, a ground select line driver circuit 220 comprises a high-voltage switch 222 and a voltage drop circuit 224. The voltage drop circuit 224 generates an output that is lower than an applied read voltage VREAD and outputs the dropped, or lowered, voltage to the high-voltage switch 222. The high-voltage switch 222 drives a signal line GS with the lowered voltage from the voltage drop circuit 224 in response to a control signal Read_EN. In this manner, the ground select line GSL is driven using a voltage that is lower than the read voltage VREAD.

Figure 6A:
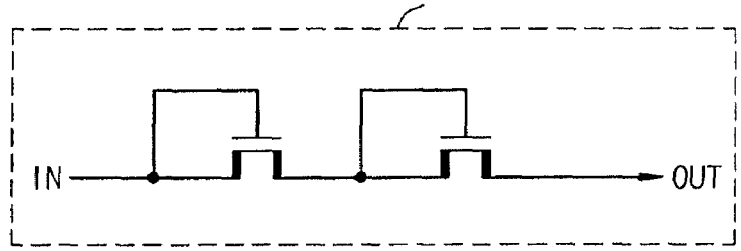
FIGS. 6A to 6D are circuit diagrams of various embodiments of voltage drop circuits illustrated in FIGS. 5A to 5B.
Figure 6B:
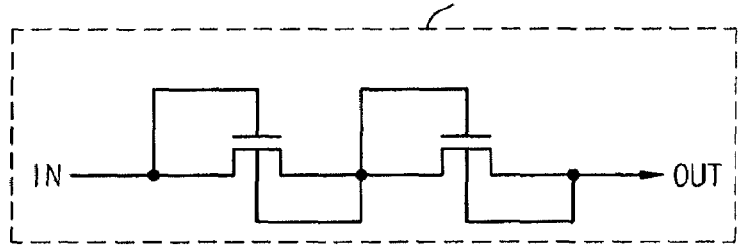
Figure 6C:
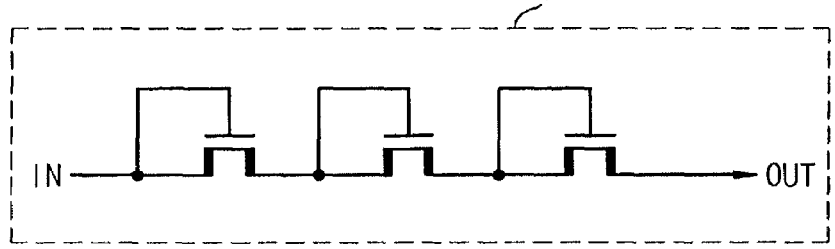
Figure 6D:
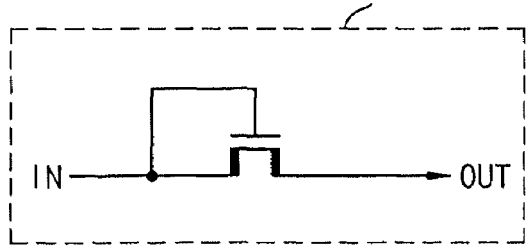

FIGS. 6A to 6D are circuit diagrams of various embodiments of the voltage drop circuits illustrated in FIGS. 5A to 5B. Referring to FIG. 6A, a voltage drop circuit 214/224 comprises diode-connected NMOS transistors which are connected in series between an input voltage IN and an output voltage OUT. Bulks of the diode-connected NMOS transistors are grounded. On the other hand, as illustrated in FIG. 6B, each of the bulks of the diode-connected NMOS transistors is connected to own source (or to a drain of an adjacent NMOS transistor). The number of diode-connected NMOS transistors can be varied to achieve a different amount of voltage level reduction. For example, as illustrated in FIG. 6C, a voltage drop circuit 214/224 can consist of three diode-connected NMOS transistors. Alternatively, as illustrated in FIG. 6D, a voltage drop circuit 214/224 can consist of one diode-connected NMOS transistor. It is apparent to one skilled in the art that the number of diode-connected NMOS transistors for use in the voltage drop circuit is not limited to the numbers provided in the present disclosure.

In this embodiment, transistors in the FIG. 6B embodiment comprise low-voltage transistors, while transistors in FIGS. 6A, 6C and 6D comprise high-voltage transistors.

The string and ground select line driver circuits 210 and 220 according to the present invention can be provided with the same type of voltage drop circuit (for example, one selected from the illustrative voltage drop circuits of FIGS. 6A to 6D). In this case, the output voltages of the driver circuits 210 and 220 are set to the same voltage level. On the other hand, the string and ground select line driver circuits 210 and 220 according to the present invention can be provided with different voltage drop circuits. In this case, the output voltages of the driver circuits 210 and 220 are set to different voltage levels from each other.

Figure 7:
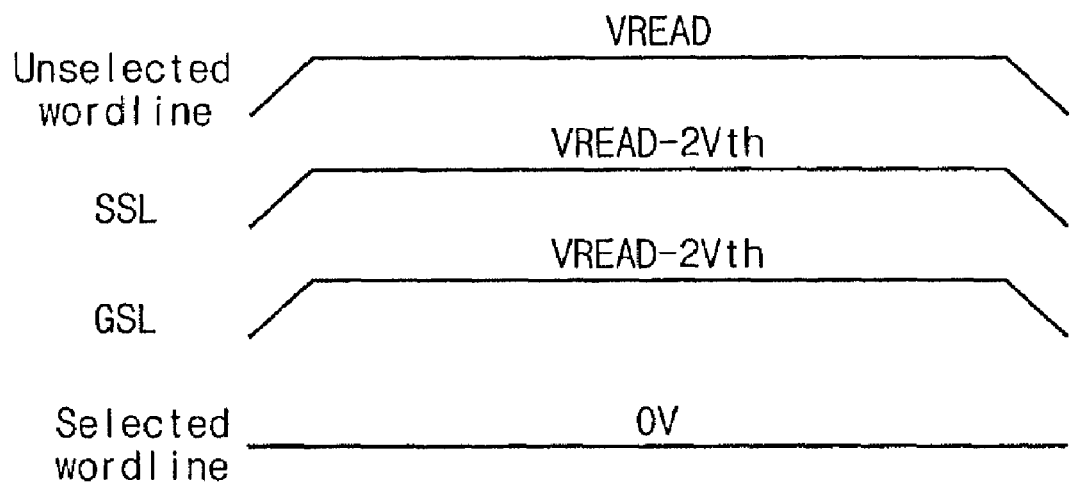
FIG. 7 illustrates voltage levels of word lines WLn-1 to WL0 and select lines SSL and GSL when a control signal Vread_EN is activated, in the embodiment of FIG. 4.

FIG. 7 illustrates voltage levels of word lines WLn-1 to WL0 and select lines SSL and GSL when a control signal Vread_EN is activated. As illustrated in FIG. 7, unselected word lines are driven by a pass/read voltage VREAD through a word line driver circuit 130 respectively, and a selected word line is driven by 0V through the driver circuit 130. At the same time, string and ground select lines SSL and GSL are driven by a voltage of VREAD-2Vth (assuming that Vth is a threshold voltage of an NMOS transistor, and assuming, in this case, that the embodiment of FIG. 6A is employed as the voltage drop circuit 214, 224) through string and ground select line driver circuits 210 and 220, respectively. Accordingly, degradation of gate oxide layers in select transistors SST and GST is mitigated or prevented by lowering the strength of an electric field applied to the transistors SST and GST. In this manner, reliability of the flash memory device is improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A non-volatile semiconductor memory device having a plurality of memory blocks each including first transistors for selecting a plurality of word lines and second transistors for selecting string select lines and ground select lines, the device further comprising:
    a charge pump configured to generate a read voltage during a read operation;
    a voltage regulator configured to control the charge pump so that the read voltage is maintained at a substantially constant level;
    a first driver circuit configured to transfer the read voltage to the first transistors during the read operation;
    a voltage generating circuit configured to generate a select voltage which is lower than the read voltage;
    at least one second driver circuit configured to drive the string select lines and ground select lines with the select voltage during the read operation; and
    at least one high voltage switch configured to output the select voltage from the at least one second driver circuit to the second transistors during the read operation in response to a read enable signal.

2. The non-volatile semiconductor memory device of claim 1, wherein the voltage generating circuit generates the select voltage which is lower than the read voltage by a voltage that corresponds to a sum of threshold voltages of plural transistors.

3. The non-volatile semiconductor memory device of claim 1, wherein the voltage generating circuit includes first and second voltage generating portions for generating a first and a second voltage each, the first voltage being applied to the string select line by the second driver circuit and the second voltage being applied to the ground select line by the second driver circuit.

4. The non-volatile semiconductor memory device of claim 3, wherein the first voltage is higher than the second voltage.

5. The non-volatile semiconductor memory device of claim 3, wherein the first voltage is lower than the second voltage.

6. The non-volatile semiconductor memory device of claim 3, wherein each of the first and second voltage generating parts is configured to generate the first and the second voltages which are lower than the read voltage by 2Vth, where Vth is a threshold voltage of an NMOS transistor.

7. A non-volatile semiconductor memory device comprising:
    cell strings connected to respective bit lines;
    each of the cell strings having a string select transistor connected to a string select line, a ground select transistor connected to a ground select line, and memory cells connected to corresponding word lines and connected in series between the string select transistor and the ground select transistor;
    a charge pump and voltage regulator configured to supply a substantially constant read voltage;
    a first voltage generating circuit configured to generate a first voltage which is lower than the read voltage during a read operation;
    a second voltage generating circuit configured to generate a second voltage which is lower than the read voltage during a read operation;
    a string select line driver circuit configured to drive the string select line with the first voltage provided by the first voltage generating circuit during a read operation in response to a read enable signal; and
    a ground select line driver circuit configured to drive a ground select line with the second voltage provided by the second voltage generating circuit during a read operation in response to the read enable signal.

* * * * *